US011950370B2

(12) United States Patent
Tokunaga et al.

(10) Patent No.: US 11,950,370 B2
(45) Date of Patent: Apr. 2, 2024

(54) INFORMATION PROCESSING DEVICE, INFORMATION PROCESSING METHOD, AND PROGRAM

(71) Applicant: FUJI CORPORATION, Chiryu (JP)

(72) Inventors: Hiroko Tokunaga, Toyota (JP); Mitsuru Sanji, Toyota (JP)

(73) Assignee: FUJI CORPORATION, Chiryu (JP)

( * ) Notice: Subject to any disclaimer, the term of this patent is extended or adjusted under 35 U.S.C. 154(b) by 50 days.

(21) Appl. No.: 17/629,274

(22) PCT Filed: Jul. 24, 2019

(86) PCT No.: PCT/JP2019/029046
§ 371 (c)(1),
(2) Date: Jan. 21, 2022

(87) PCT Pub. No.: WO2021/014613
PCT Pub. Date: Jan. 28, 2021

(65) Prior Publication Data
US 2022/0248578 A1 Aug. 4, 2022

(51) Int. Cl.
*H05K 13/04* (2006.01)
*H05K 13/08* (2006.01)

(52) U.S. Cl.
CPC ..... *H05K 13/0882* (2018.08); *H05K 13/0408* (2013.01); *Y10T 29/53174* (2015.01)

(58) Field of Classification Search
CPC ........... H05K 13/0408; H05K 13/0882; H05K 13/04; H05K 13/00; G06F 3/038; G05B 2219/39484; Y10T 29/53174
(Continued)

(56) References Cited

U.S. PATENT DOCUMENTS 6,860,002 B2 * 3/2005 Oyama ............ H05K 13/0409
29/832
10,569,351 B2 * 2/2020 Otsubo .................. B23K 1/085
10,796,353 B2 10/2020 Iwaki et al.

FOREIGN PATENT DOCUMENTS

JP 60-202998 A 10/1985
JP 2013-222771 A 10/2013
(Continued)

OTHER PUBLICATIONS

International Search Report dated Oct. 15, 2019 in PCT/JP2019/029046 filed on Jul. 24, 2019, citing references AP-AR herein, 2 pages.

*Primary Examiner* — Thiem D Phan
(74) *Attorney, Agent, or Firm* — Oblon, McClelland, Maier & Neustadt, L.L.P.

(57) ABSTRACT

An information processing device is used in a mounting system that performs processing of mounting a component on a mounting target. The information processing device includes: a memory section configured to store multiple pieces of abutting part data including a shape of an abutting part that abuts against the component, multiple pieces of attachment part data including a shape of an attachment part to be attached to an attachment section to which a collection member for collecting the component is attached, and multiple pieces of connection part data including a shape of a connection part that connects the abutting part and the attachment part, in the collection member; and a control section configured to output one or more of the abutting part data, the attachment part data, and the connection part data stored in the memory section.

10 Claims, 12 Drawing Sheets

(58) Field of Classification Search
USPC .......................... 29/739, 720, 740, 741, 832
See application file for complete search history.

(56) References Cited

FOREIGN PATENT DOCUMENTS

| | | |
|---|---|---|
| JP | 2017-69332 A | 4/2017 |
| JP | 2017-211685 A | 11/2017 |
| WO | WO 2016/084122 A1 | 6/2016 |

* cited by examiner

Fig. 3
Fig. 3A
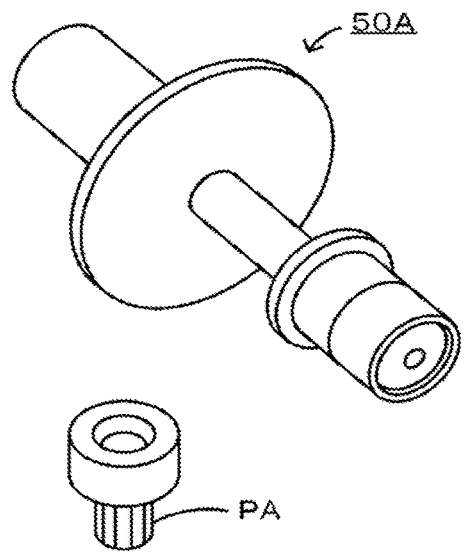
Fig. 3B
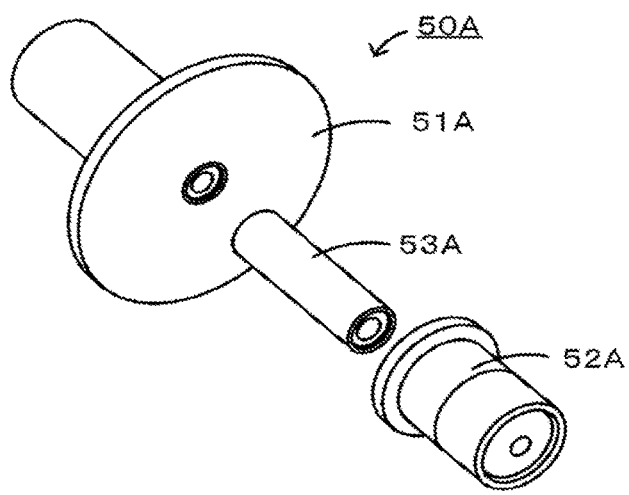
Fig. 4
Fig. 4A
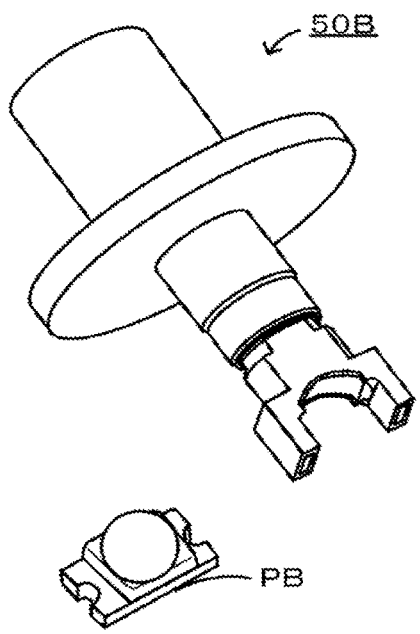
Fig. 4B
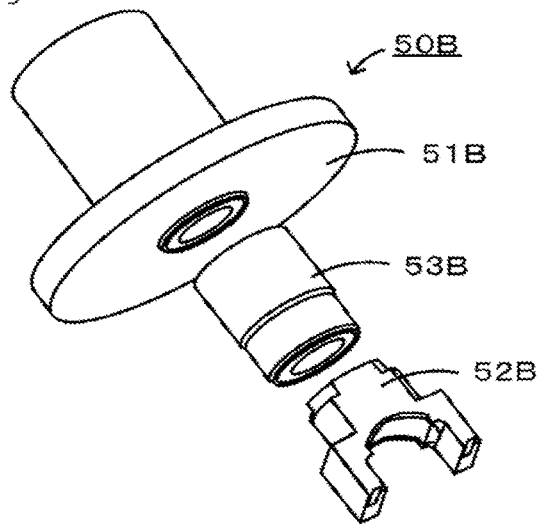

Fig. 5
Fig. 5A
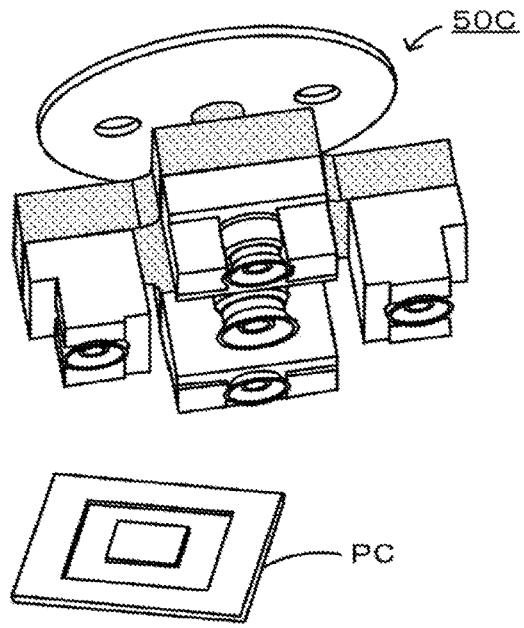
Fig. 5B
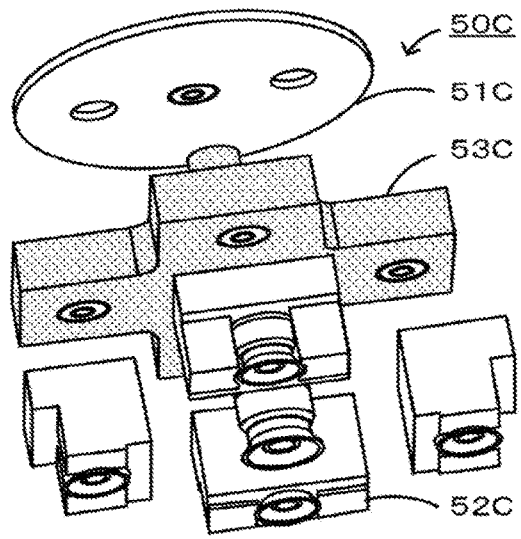
Fig. 6
Fig. 6A
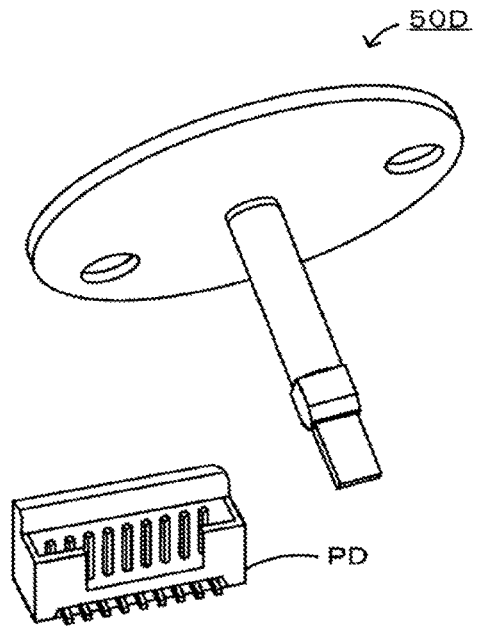
Fig. 6B
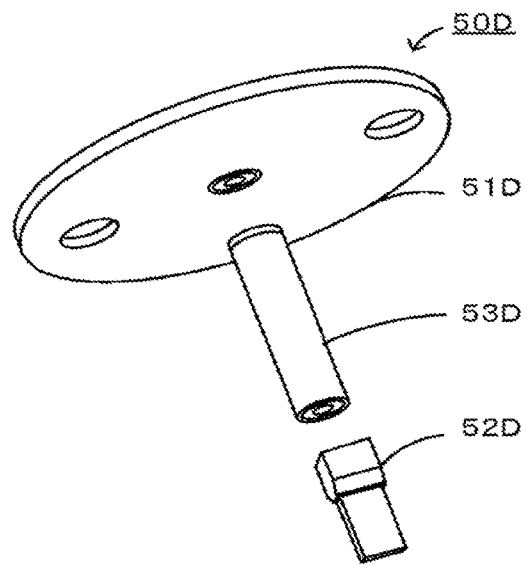

Fig. 7
Fig. 7A
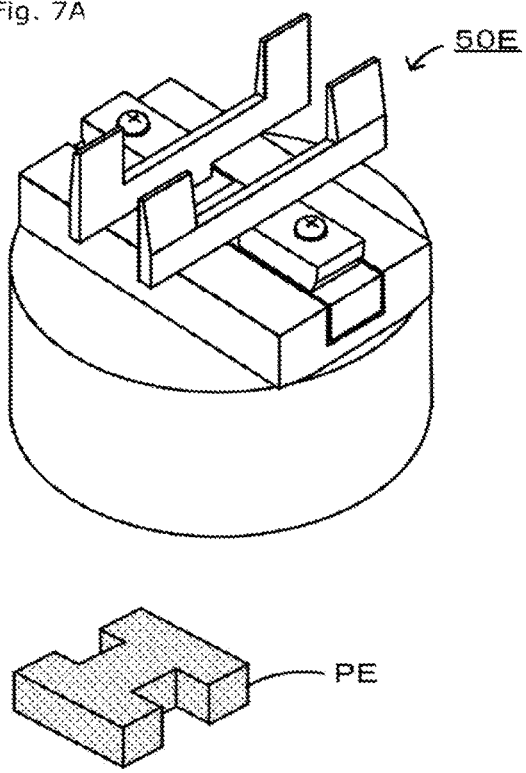
Fig. 7B
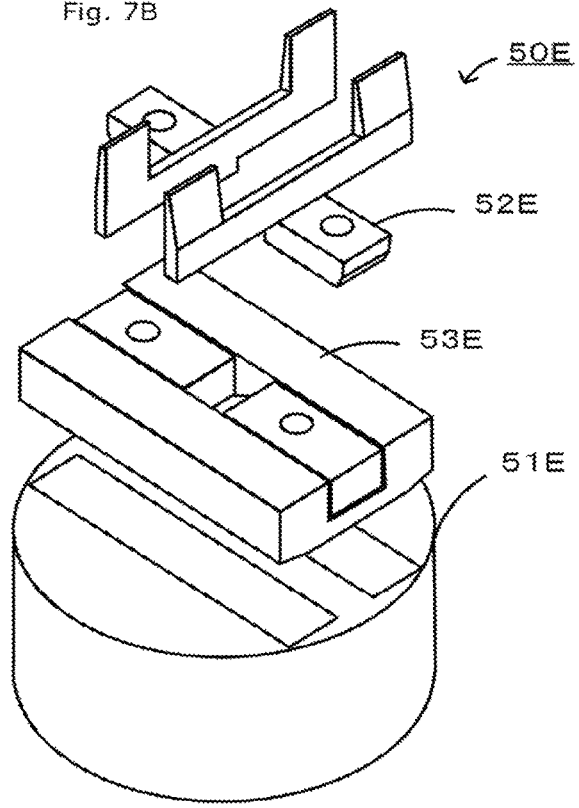
Fig. 8
Fig. 8A
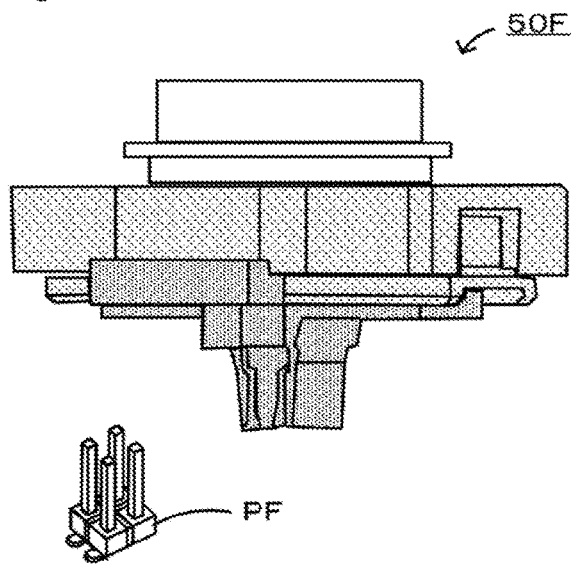
Fig. 8B
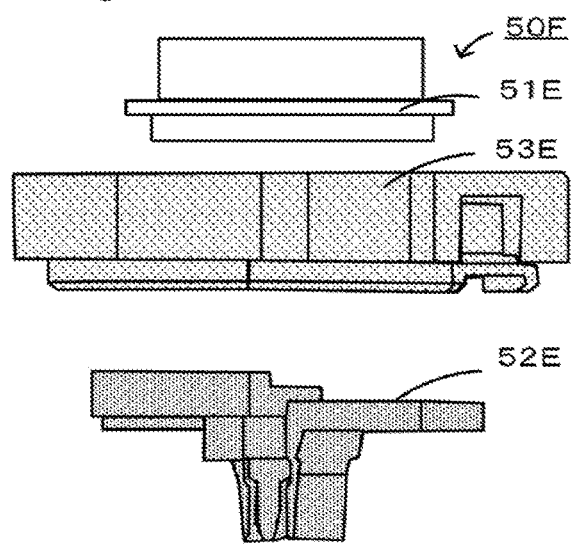

Fig. 15
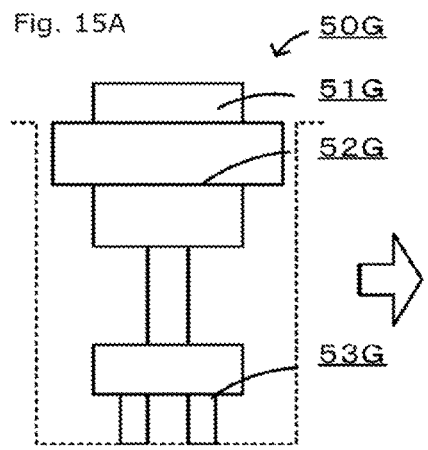
Fig. 15A
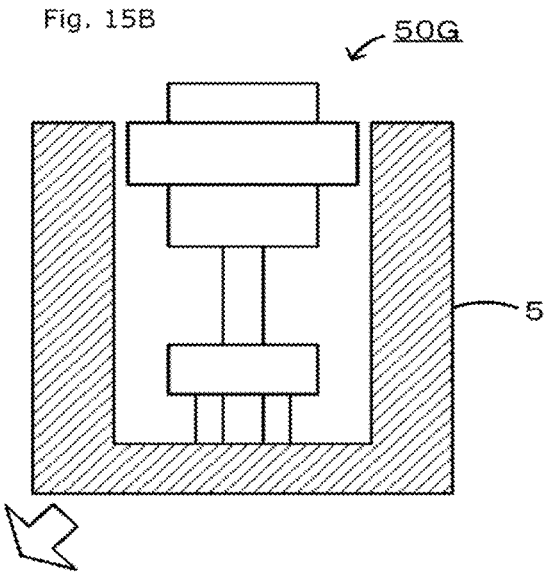
Fig. 15B
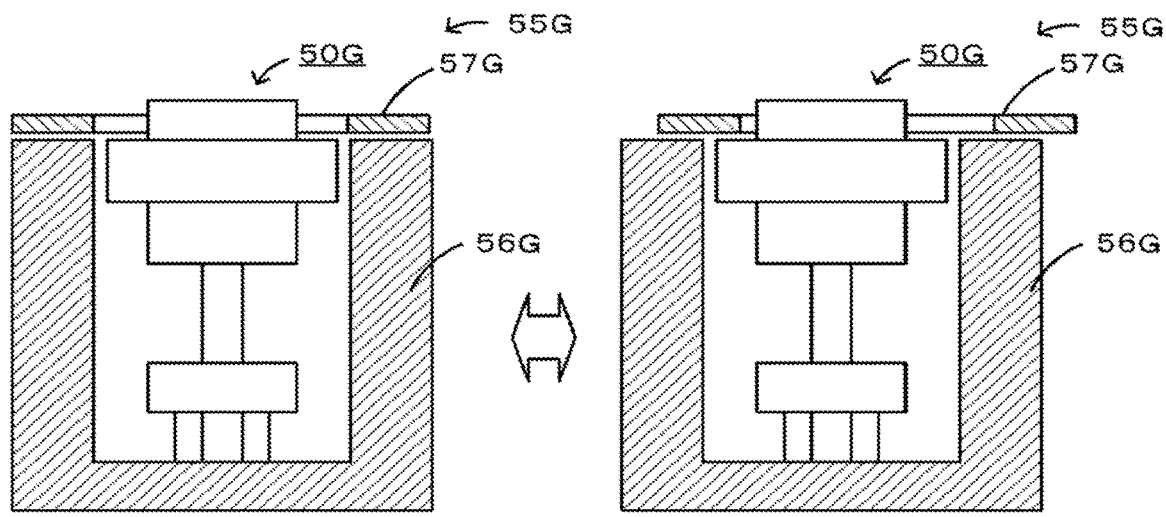
Fig. 15C

INFORMATION PROCESSING DEVICE, INFORMATION PROCESSING METHOD, AND PROGRAM

TECHNICAL FIELD

In the present specification, an information processing device, an information processing method, and a program are disclosed.

BACKGROUND ART

Conventionally, as a system used in a mounting device, a system has been proposed in which information on a component having a specific shape and a member accommodating the component is acquired, and design data of an attachment member designed based on the acquired information is output to a terminal of a client (for example, refer to Patent Literature 1). In this system, since a collection member is manufactured on a client side based on the design data, it is possible to provide the attachment member as a more suitable work sharing.

PATENT LITERATURE

Patent Literature 1: International Publication No. WO2016/084122

BRIEF SUMMARY

Technical Problem

However, in the system described in Patent Literature 1, since the design data of the collection member for collecting a component having a specific shape is generated according to the skill of a designer, it is desired to more easily manufacture a new collection member.

The present disclosure has been made in view of such problems and a main object of the present disclosure is to provide an information processing device, an information processing method, and a program capable of more easily realizing the manufacture and use of a new collection member.

Solution to Problem

The present disclosure employs the following means in order to achieve the main object described above.

An information processing device of the present disclosure is an information processing device used in a mounting system that performs processing of mounting a component on a mounting target, the information processing device including: a memory section configured to store multiple pieces of abutting part data including a shape of an abutting part that abuts against the component, multiple pieces of attachment part data including a shape of an attachment part to be attached to an attachment section to which a collection member for collecting the component is attached, and multiple pieces of connection part data including a shape of a connection part that connects the abutting part and the attachment part, in the collection member; and a control section configured to output one or more of the abutting part data, the attachment part data, and the connection part data stored in the memory section.

In the information processing device, the multiple pieces of abutting part data including the shape of the abutting part that abuts against the component, the multiple pieces of attachment part data including the shape of the attachment part to be attached to the attachment section to which a collection member for collecting the component is attached, and the multiple pieces of connection part data including the shape of the connection part that connects the abutting part and the attachment part are stored. One or more of the abutting part data, the attachment part data, and the connection part data is output. Generally, for example, the collection member for collecting a component having a specific shape (special shape) is individually designed according to the shape and the size of the component. Since the design data of the designed collection member is managed as a whole, it is difficult to efficiently utilize a development resource thereof. In the information processing device of the present disclosure, for example, since the individually designed collection member is stored as data in a state of being divided into the abutting part, the attachment part, and the connection part, each part can be used in an appropriate combination when there are individual special components. Accordingly, in the information processing device of the present disclosure, by managing the data for each part, it is possible to more easily realize the manufacture and use of a new collection member. Here, the connection part may be a single structure or may be a structure which is divided into two or more parts. That is, the connection part data may be data of multiple portions.

BRIEF DESCRIPTION OF DRAWINGS

FIG. 3 is an explanatory view schematically illustrating configurations of collection member 50A and component PA.

FIG. 4 is an explanatory view schematically illustrating configurations of collection member 50B and component PB.

FIG. 5 is an explanatory view schematically illustrating configurations of collection member 50C and component PC.

FIG. 6 is an explanatory view schematically illustrating configurations of collection member 50D and component PD.

FIG. 7 is an explanatory view schematically illustrating configurations of collection member 50E and component PE.

FIG. 8 is an explanatory view schematically illustrating configurations of collection member 50F and component PF.

FIG. 15 is an explanatory view for designing collection member accommodation section 55G for accommodating collection member 50G.

DESCRIPTION OF EMBODIMENTS

Figure 1:
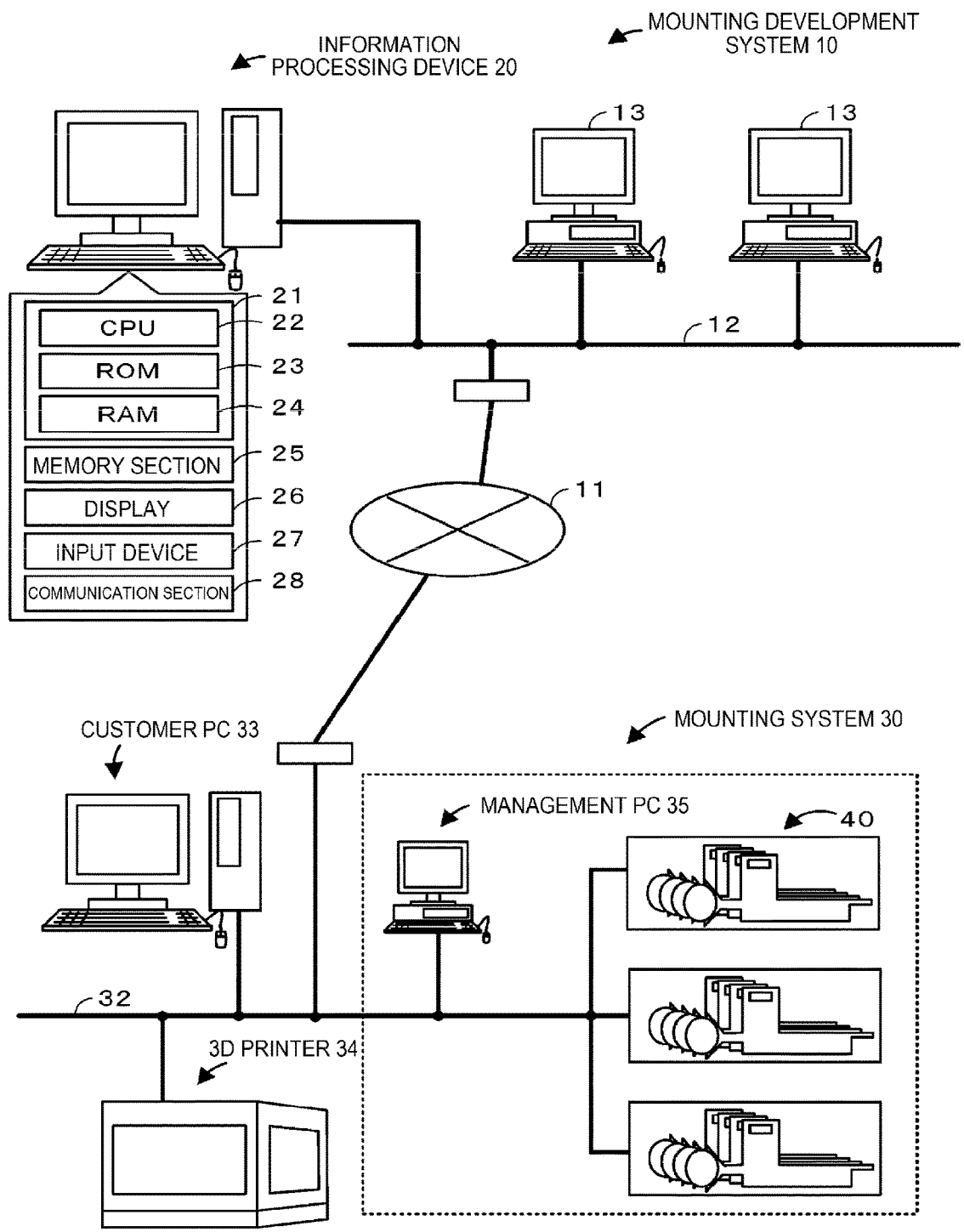
FIG. 1 is a schematic explanatory view of mounting development system 10 and mounting system 30.
Figure 2:
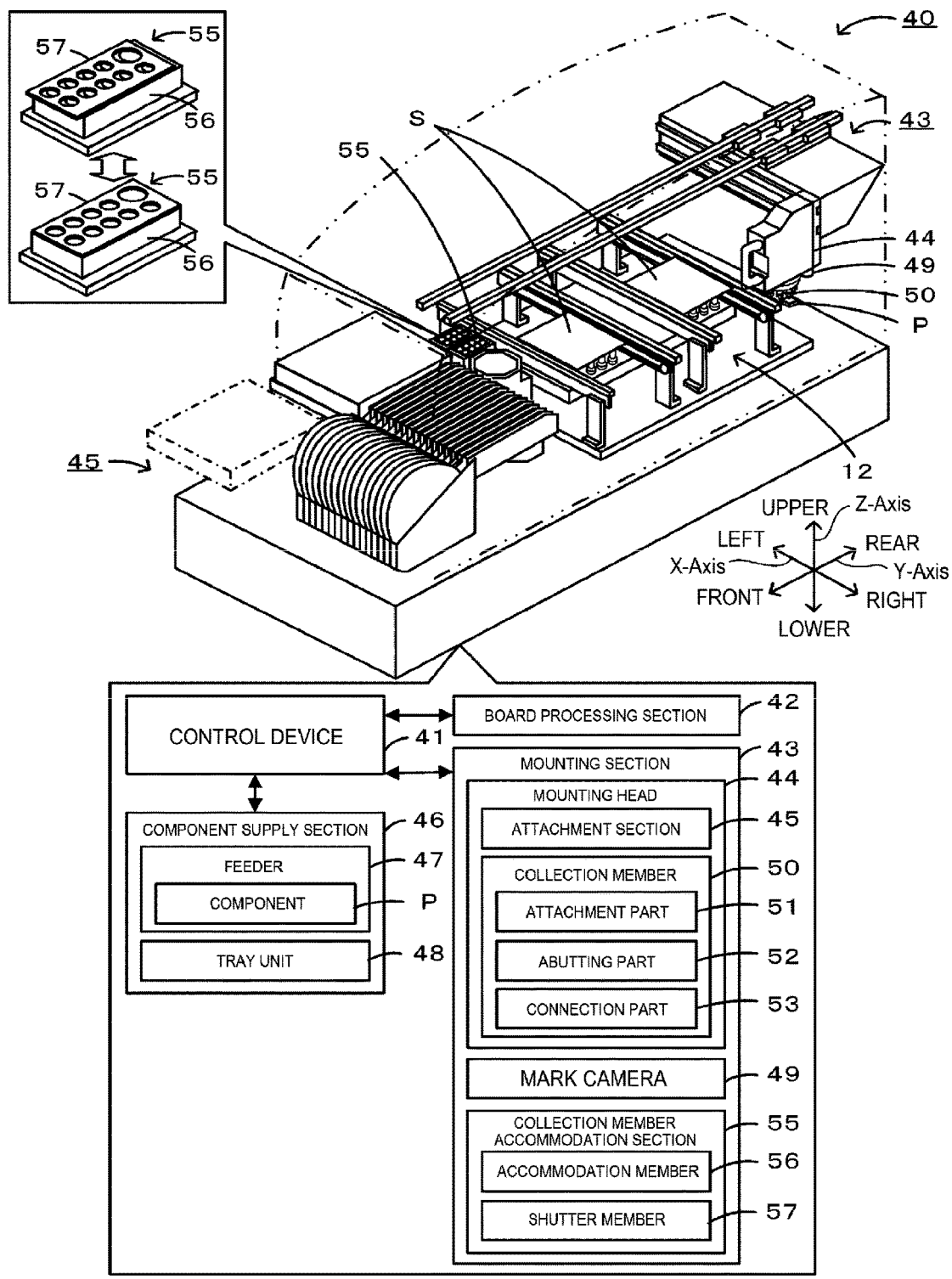
FIG. 2 is an explanatory view schematically illustrating a configuration of mounting device 40.
Figure 9:
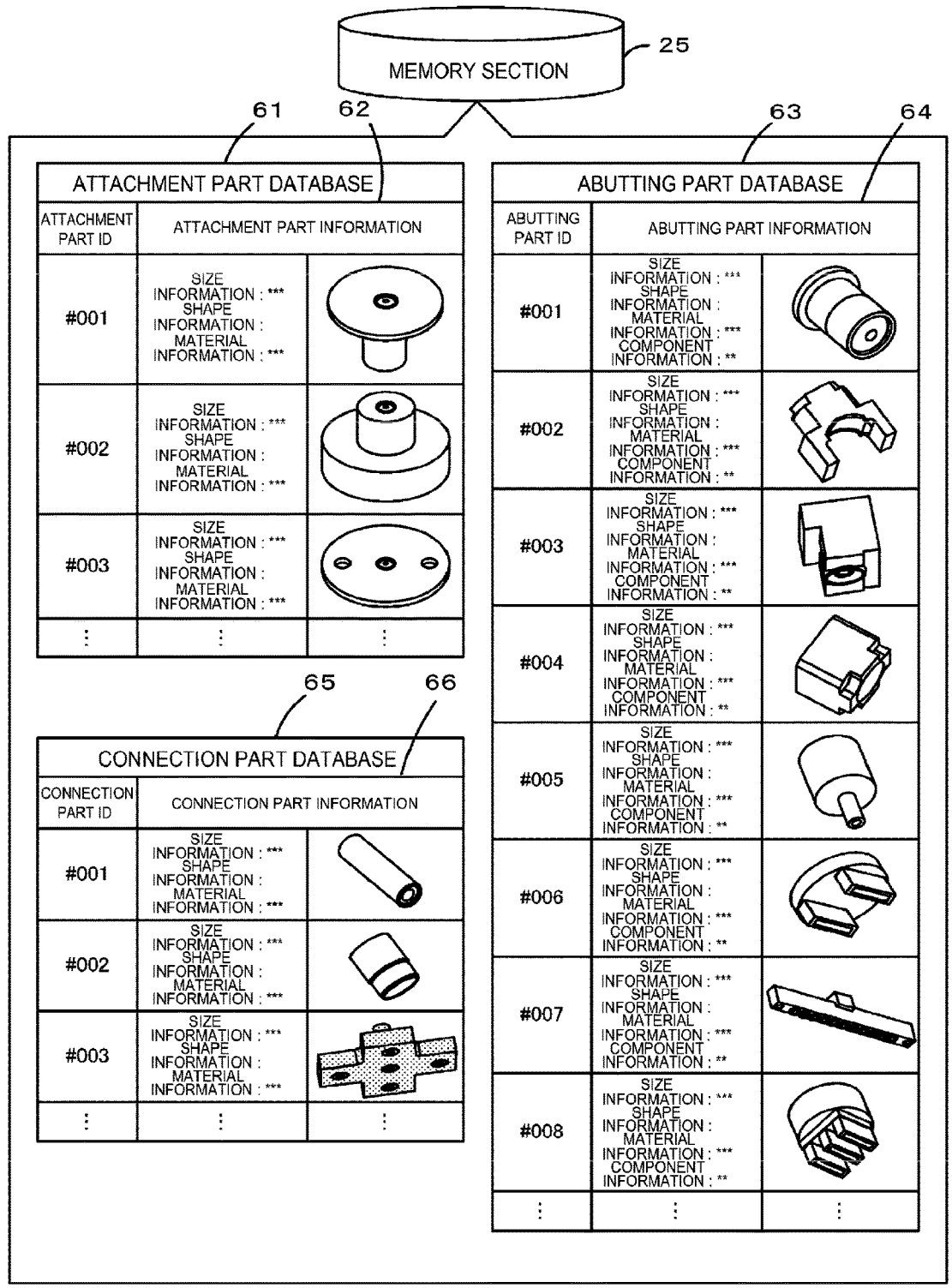
FIG. 9 is an explanatory view of information stored in memory section 25.

Preferable embodiments of information processing device 20 disclosed in the present specification will be described below with reference to the accompanying drawings. FIG. 1 is a schematic explanatory view of mounting development system 10 including information processing device 20 and mounting system 30 including mounting device 40 serving as a mounting-related device. FIG. 2 is an explanatory view schematically illustrating a configuration of mounting device 40. FIGS. 3 to 8 are explanatory views schematically illustrating configurations of collection members 50A to 50F and components PA to PF. FIG. 9 is an explanatory view of attachment part database 61, abutting part database 63, and connection part database 65 stored in memory section 25. In the present embodiment, a left-right direction (X-axis), a front-rear direction (Y-axis), and up-down direction (Z-axis) are as illustrated in FIG. 2. In addition, mounting system 30 includes a printing device that applies a predetermined coating agent (for example, a solder paste or an adhesive) to a board, a curing processing device (for example, a reflow furnace) that cures the coating agent applied to the board, an inspection device that inspects a state of the board or the component, a conveyance device that conveys the board, and the like, in addition to mounting device 40 that mounts component P on board S (refer to FIG. 2) as a mounting target. In addition, a mounting target portion includes a three-dimensional base material in addition to board S.

As illustrated in FIG. 1, mounting development system 10 owned by a supplier side includes multiple design personal computers (PCs) 13 connected to LAN 12, and information processing device 20 connected to LAN 12. Design PC 13 is a computer that designs a device to be incorporated in mounting system 30, an attachment member to be attached to mounting device 40, or the like. Information processing device 20 is configured as a server that handles information on a mounting-related device that executes processing relating to mounting processing of mounting component P on board S. Information processing device 20 is configured to provide, for example, order receipt, delivery, and design data of attachment members to be attached to mounting device 40, and the like. Information processing device 20 transmits data to customer PC 33 via network 11 such as an Internet, and receives information from customer PC 33. Information processing device 20 includes control section 21 for controlling the entire device, memory section 25 for storing various application programs and various data files, display 26 for displaying various information, input device 27 such as a keyboard and a mouse for inputting various commands by an operator, and communication section 28 for communicating with an external device such as design PC 13. Control section 21 is configured as a microprocessor centered on CPU 22 and includes ROM 23 storing various processing programs and the like, and RAM 24 temporarily storing data.

In the system on the customer side, mounting system 30, customer PC 33, and 3D printer 34 are each connected to LAN 32. Customer PC 33 includes a control section including a CPU or the like, a display, an input device, and a communication section. Customer PC 33 exchanges data with, for example, management PC 35 of mounting system 30 and the like, and exchanges data with information processing device 20 via network 11. 3D printer 34 is configured to form a three-dimensional object using a material such as resin, carbon, or metal, for example, based on design data. Mounting system 30 is configured as a production line for mounting component P on board S and includes multiple mounting devices 40, a printing device, an inspection device, a reflow furnace which are not illustrated, and the like. In addition, mounting system 30 includes management PC 35 that manages information used in mounting device 40 or the like.

As illustrated in FIG. 2, mounting device 40 includes control device 41, board processing section 42, mounting section 43, and component supply section 46. Control device 41 is configured as a microprocessor centered on a CPU and controls the entire device. Control device 41 is connected to board processing section 42, mounting section 43, component supply section 46, and the like so as to be capable of bidirectional communication, and exchanges signals with these units and the like. Control device 41 stores member management information relating to the attachment member to be attached to mounting device 40, and executes the mounting processing while grasping what kind of attachment member is attached by using the member management information. Mounting section 43 is a unit that collects component P from component supply section 46 and disposes component P on board S fixed to board processing section 42. Mounting section 43 includes mounting head 44, a moving section for moving mounting head 44, mark camera 49, collection member 50, and collection member accommodation section 55. Mounting head 44 is configured to collect one or more components and move in XY-directions by a moving section. Mounting head 44 is detachably attached to a slider. One or more collection members 50 is detachably attached to attachment section 45 on a lower surface of mounting head 44. Collection member 50 is any one or more of a nozzle for collecting component P by applying a pressure and a mechanical chuck for gripping and physically collecting component P. Mark camera 49 is disposed on a lower surface side of the slider to which mounting head 44 is attached, moves in XY-directions in accordance with the movement of mounting head 44, and captures an image of a mark or the like formed on board S. Mark camera 49 is also used when reading identification information formed on collection member 50 or identification information formed on collection member accommodation section 55. Component supply section 46 is a unit for supplying component P to mounting section 43. Component supply section 46 includes multiple feeders 47 to which tapes holding components P are attached, and has tray unit 48 in which multiple components are arranged and placed on a tray.

Collection member accommodation section 55 is a unit that accommodates and holds collection member 50 when waiting before collection member 50 is attached to attachment section 45. Collection member accommodation section 55 includes accommodation member 56, shutter member 57, and driving section (not illustrated). Accommodation member 56 is a member, of which an upper portion in which an accommodation space for accommodating collection member 50 is formed, is open. Shutter member 57 is a plate-shaped member that fixedly holds and releases the fixation of collection member 50 accommodated in accommodation member 56, and a through-hole through which collection member 50 can pass is formed in a plate surface. Shutter member 57 locks and fixes collection member 50 by abutting an edge portion of the through-hole on a flange or an upper surface of collection member 50. Shutter member 57 is constantly biased to a fixed position for fixing collection member 50 (refer to an upper drawing in FIG. 2), and is moved to a fixation releasing position by a driving section when collection member 50 is removed (refer to a lower drawing in FIG. 2).

Here, collection member 50 will be described. In mounting device 40, as illustrated in FIGS. 3 to 8, components PA to PF having special shapes and/or special purposes are mounted on board S. Therefore, as illustrated in FIGS. 3 to 8, mounting device 40 uses collection members 50A to 50G (refer to FIG. 15) having special shapes. Here, collection members 50A to 50G are collectively called collection member 50, attachment parts 51A to 51G are collectively called attachment part 51, abutting parts 52A to 52G are collectively called abutting part 52, and connection parts 53A to 53G are collectively called connection part 53. Collection member 50 can be classified into, for convenience, attachment part 51 to be attached to the attachment section 45 to which collection member 50 is attached, abutting part 52 to abut component P, and connection part 53 to connect attachment part 51 and the abutting part. Attachment part 51, abutting part 52, and connection part 53 may be integrally molded, or may be joined by another member. The shape and size of attachment part 51 are determined by attachment section 45 of mounting head 44. The shape and size of abutting part 52 are determined so as to be suitable for collecting component P having a predetermined shape. Connection part 53 has a structure corresponding to abutting part 52 and further has a shape and a size determined so as to be appropriately connected to attachment part 51. Specifically, for example, collection member 50A illustrated in FIG. 3 has cylindrical component PA to be collected, abutting part 52A of a round nozzle, and cylindrical connection part 53A. Collection member 50B illustrated in FIG. 4 has a spherical surface of component PB to be collected, abutting part 52B of a spork nozzle, and a cylindrical connection part 53B. Component PB to be collected has a surface having a step and collection member 50C illustrated in FIG. 5 has multiple abutting parts 52C of a spork nozzle, and connection part 53C that branches a pressure to each of multiple abutting parts 52C. Collection member 50D illustrated in FIG. 6 has abutting part 52D of an angle nozzle to be inserted into a gap of component PD to be collected, and cylindrical connection part 53D. Collection member 50E illustrated in FIG. 7 has abutting part 52E having gripping claws that grip multiple locations on a side surface of component PE to be collected, and connection part 53E as an actuator for driving abutting part 52E. Connection part 53E has an air cylinder operated by the pressure supplied from attachment part 51E. Collection member 50F illustrated in FIG. 7 has abutting part 52F having a fixing member inserted between pins of component PF to be collected and a gripping claw that grips the pin from the outside, and connection part 53F as an actuator for driving abutting part 52F. Connection part 53F has an air cylinder operated by the pressure supplied from attachment part 51F.

Next, information stored in memory section 25 of information processing device 20 owned by the supplier side will be described. As illustrated in FIG. 9, for example, memory section 25 stores a component information database (not illustrated) and the like in addition to attachment part database 61, abutting part database 63, and connection part database 65. In FIG. 9, a schematic diagram of each part is attached for easy understanding. Attachment part database 61 is configured as a database including multiple types of attachment part information 62 including information on attachment part 51. Attachment part information 62 includes size information including the size of attachment part 51, shape information including shape data of attachment part 51, material information indicating a material forming attachment part 51, and the like, which are associated with identification information (ID) of attachment part 51. The material information includes, for example, information of various resins, metals, carbon, and the like as materials that can be used in 3D printer 34 forming the part. Abutting part database 63 is configured as a database including multiple types of abutting part information 64 including information on abutting part 52. Abutting part information 64 includes size information including the size of abutting part 52, shape information including the shape data of abutting part 52, material information indicating the material forming abutting part 52, information on the component to be collected at abutting part 52 as an example, and the like, which are associated with identification information (ID) of abutting part 52. Connection part database 65 is configured as a database including multiple types of connection part information 66 including information on connection part 53. Connection part database 65 includes size information including the size of connection part 53, shape information including the shape data of connection part 53, material information indicating the material forming connection part 53, and the like, which are associated with identification information (ID) of connection part 53. Each part information described above may include CAD data. As described above, in memory section 25, each configuration of collection member 50 is divided and saved, and is managed in a state available to the user. Information processing device 20 outputs information of each part in response to a request from design PC 13, customer PC 33, and the like, and provides information to them. The component information database includes multiple pieces of component information in which size information, shape information, and material information of the component are associated with the component IDs. Information of the component can be obtained from the component ID. When a new component appears and new collection member 50 is set, and the like, an operator registers the same in each of the above-described databases so as to make it an available state to other operators.

Figure 10:
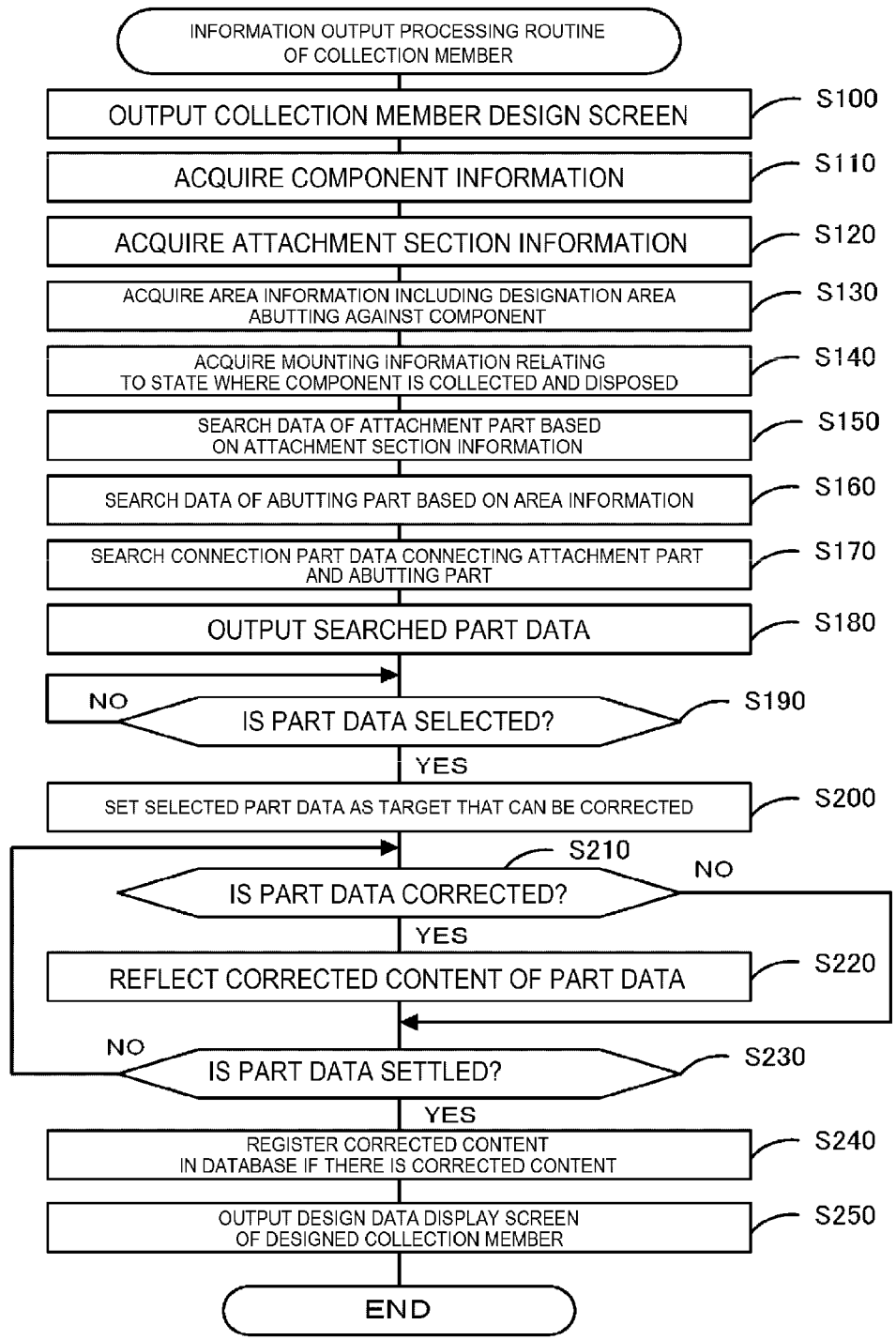
FIG. 10 is a flowchart illustrating an example of a collection member information output processing routine.

Next, an operation of mounting development system 10 of the present embodiment, first, an operation when an information provision of collection member 50 is requested in order for a user on the customer side to handle component P of a special shape or a special purpose will be described. Here, the exchange of information between information processing device 20 and customer PC 33 will be mainly described. In addition, here, a case where collection member 50 of the suction nozzle is mainly designed will be described. For example, in a case where the user on the customer side performs a new mounting processing of a specific component that cannot be collected by collection member 50 owned by the customer, the user accesses information processing device 20 from customer PC 33 to request acquisition of design data relating to collection member 50. FIG. 10 is a flowchart illustrating an example of a collection member information output processing routine executed by CPU 22 of information processing device 20. This routine is stored in memory section 25 and executed after an access is made from an external device. When this routine is started, CPU 22 of control section 21 outputs collection member design screen 70 to customer PC 33 (step S100).

Figure 11:
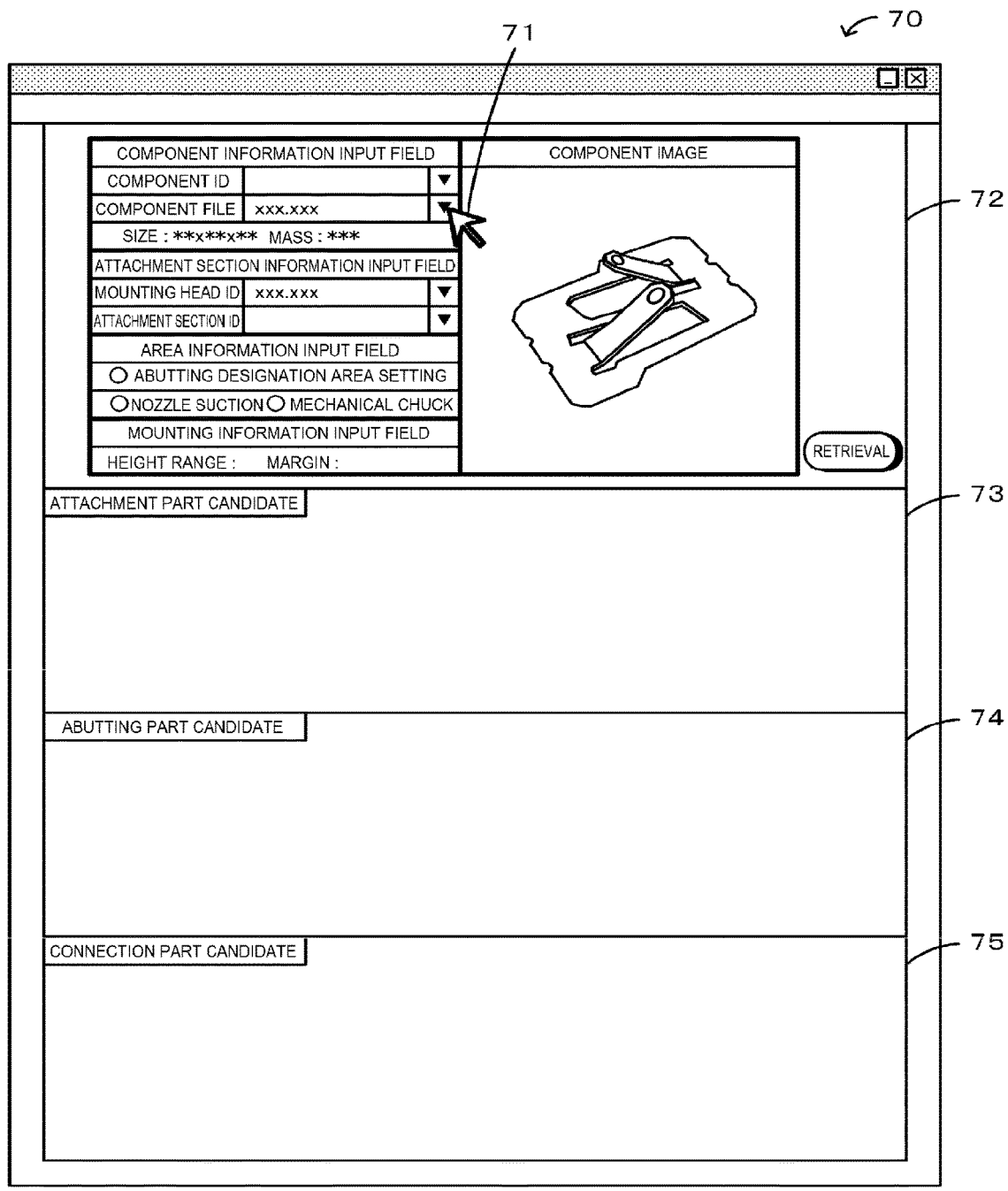
FIG. 11 is an explanatory view illustrating an example of collection member design screen 70 after component input.
Figure 12:
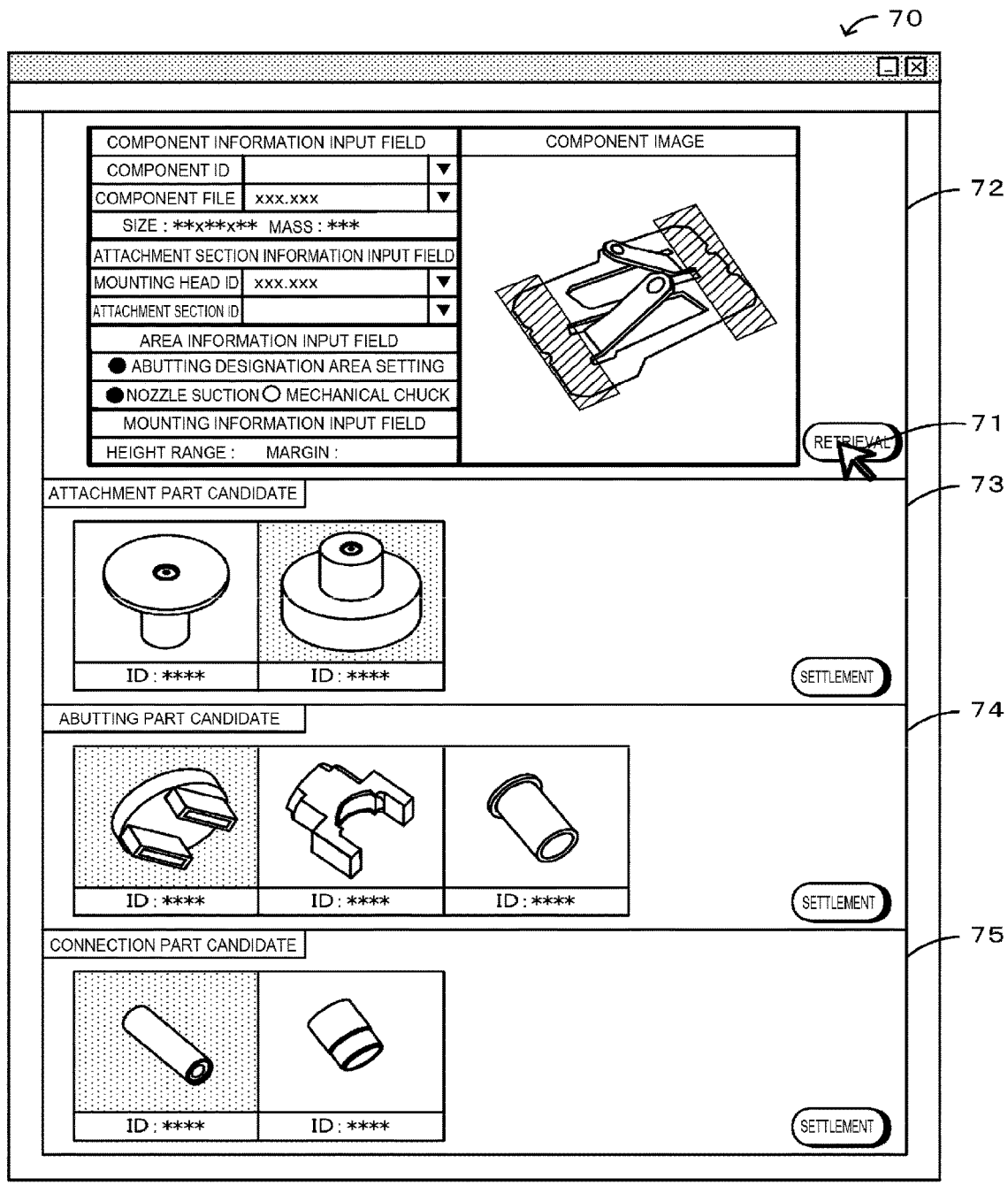
FIG. 12 is an explanatory view illustrating an example of collection member design screen 70 after searching.

FIG. 11 is an explanatory view illustrating an example of collection member design screen 70 displayed on, for example, a display of customer PC 33 and outputted. FIG. 11 illustrates an example after the component information is inputted. FIG. 12 is an explanatory view illustrating an example of search of each part of collection member design screen 70. Collection member design screen 70 is a screen on which the user inputs respective information and searches candidates for respective parts of collection member 50 suitable for the information, and which supports a desired design of collection member 50. Collection member design screen 70 includes cursor 71, information input field 72, attachment part candidate display field 73, abutting part candidate display field 74, connection part candidate display field 75, and the like. Cursor 71 is intended to be selected and inputted by the operator to an input field disposed on the screen, and is moved on the screen by operating input device 27. Information input field 72 is a field for inputting information relating to component P, attachment section 45, and the like. Information input field 72 includes a component information input field, an attachment section information input field, an area information input field, a mounting information input field, a component image display field, a search key, and the like. The component information input field includes an input field for the component ID, a field for designating a component file, and a free input field for inputting a size, a mass, and the like. Each of the input fields may be configured to be able to select an input content by a pull-down menu. The attachment section information input field includes a mounting head ID input field, an attachment section ID input field, and the like. The mounting head ID is information for specifying the mounting head and the attachment section ID is information for specifying the attachment section itself. These are all information for specifying the shape of the portion to which collection member 50 is to be attached. The area information input field includes a designation area in which abutting part 52 abuts against component P. The designation area is an area in which the user designates a part on component P against which abutting part 52 can abut when collecting component P. Here, the designation area can be directly designated on an image of the component in the component image display field by an operation of the user. For example, as illustrated by a hatched area in FIG. 12, the user can designate the designation area by operating cursor 71. The area information input field includes a check box for performing the setting of the designation area, and a check box for selecting any one of the collection of component P by the nozzle pickup and the collection of component P by the mechanical chuck. An input field capable of inputting the number of abutting parts may be provided in the area information input field. The mounting information input field is a field for inputting information on other mounting processing. For example, in a case where the mounting target is a three-dimensional object and there is a limit in short and long of stroke, or a distance (margin) between another structure and component P, the user inputs the conditions in the input field. The information inputted in the mounting information input field is used, for example, when specifying the shape and length of connection part 53. In the component image display field, an image of component P is three-dimensionally displayed. The user can rotate component P three-dimensionally by clicking the component image displayed in the component image display field and operating cursor 71. The search key is a key pressed when a search is started with the input content. Attachment part candidate display field 73 is a field for displaying candidates for attachment part 51 and displays information such as images and an ID of attachment part 51 (refer to FIG. 12). Abutting part candidate display field 74 is a field for displaying candidates for abutting part 52 and displays information such as an image and an ID of abutting part 52. Connection part candidate display field 75 is a field for displaying candidates for connection part 53 and displays information such as an image and an ID of connection part 53. The user inputs various information such as component information, attachment section information, area information, and mounting information in information input field 72.

After outputting collection member design screen 70, CPU 22 acquires the component information by acquiring the input contents to the component information input field (S110), and acquires the attachment section information by acquiring the input contents to the attachment section information input field (S120). In addition, CPU 22 acquires the area information including the designation area abutting against the component by acquiring the input contents in the area information input field (S130), and acquires the mounting information relating to a state where component P is collected and disposed by acquiring the input contents in the mounting information input field (S140). CPU 22 may acquire the various types of information each time the information is inputted to each of the input fields, and the order in which the various types of information are acquired may not be the order of steps described above.

Next, when the search key is pressed on collection member design screen 70, CPU 22 executes processing of searching the data of each part of collection member 50 according to the inputted information (S150 to 170). Specifically, CPU 22 searches, based on the acquired attachment section information, the data of attachment part 51 that can be attached to designated attachment section 45 from among those registered in attachment part database 61 (S150). In addition, CPU 22 searches the data of abutting part 52 corresponding to one or more of the size, the shape, the number, and the position of the designation area included in the acquired area information from among those registered in abutting part database 63 (S160). In addition, CPU 22 searches the data of connection part 53 to which attachment part 51 and abutting part 52 can be joined, which is the search result, from among those registered in connection part database 65 (S170). CPU 22 may search the registered each part data so as to include, for example, data to which deformation such as expansion, enlargement, and reduction has been added. CPU 22 can uniquely extract information corresponding to the attachment section information in the attachment part data. In addition, CPU 22 extracts, from the abutting part data, information having a shape or a size corresponding to the shape, the size, or the position of the abutting surface of component P that is the designation area. For example, in a case where collection member 50 is a suction nozzle, CPU 22 extracts abutting part data having an abutting surface of an extent that does not exceed the size of the designation area. In addition, in a case where the designation area is rectangular, CPU 22 can extract data having a rectangular abutting surface or data having a circular abutting surface included in the rectangle. In a case where there are multiple designation areas, CPU 22 may extract data having multiple abutting surfaces such as a spork nozzle, or may extract data in which multiple nozzles are used as multiple locations. In addition, CPU 22 may extract the connection part data for each combination of the extracted attachment part data and the abutting part data.

Next, CPU 22 displays and outputs the attachment part data, the abutting part data, and the connection part data, which are the search results, in attachment part candidate display field 73, abutting part candidate display field 74, and connection part candidate display field 75, respectively (S180). CPU 22 outputs data such that the image of each part is displayed in each display field of collection member design screen 70 (refer to FIG. 12). The user can select the displayed image by clicking on it. In addition, the user can activate edition software by double-clicking the image in each display field to correct and edit the size, the shape, the material, and the like of the part data. Next, CPU 22 determines whether any of the part data is selected (S190), and waits as it is when the part data is not selected. On the other hand, when the part data is selected, CPU 22 sets the selected part data as a target that can be corrected (S200), and determines whether the selected part data is corrected (S210). For example, the user corrects and edits the size, the shape, the material, and the like of the part data by operating the edition software. When the part data is corrected, CPU 22 causes the corrected content to be reflected and displayed in the display field (S220). At this time, in a case where the size of the part is changed so as to be large, CPU 22 may obtain a weight from a volume occupying a space of the part, and in a case where the obtained weight exceeds a predetermined threshold, may perform processing of changing the material thereof to a lighter one so as not to exceed the threshold.

After S220 or when there is no correction in the part data in S210, CPU 22 determines whether all the part data are settled (S230). The settlement of the part data can be determined, for example, by whether a settlement key displayed in attachment part candidate display field 73, abutting part candidate display field 74, and connection part candidate display field 75 is pressed (refer to FIG. 12). If all the part data are not settled, CPU 22 executes the processing in S210 and the subsequent steps. On the other hand, in a case where all the part data are settled, if there is the corrected content, CPU 22 newly registers the corrected content in the database (S240), causes design data display screen 76 displaying the design data of the designed collection member to be displayed and outputted (S250), and terminates the routine.

Figure 13:
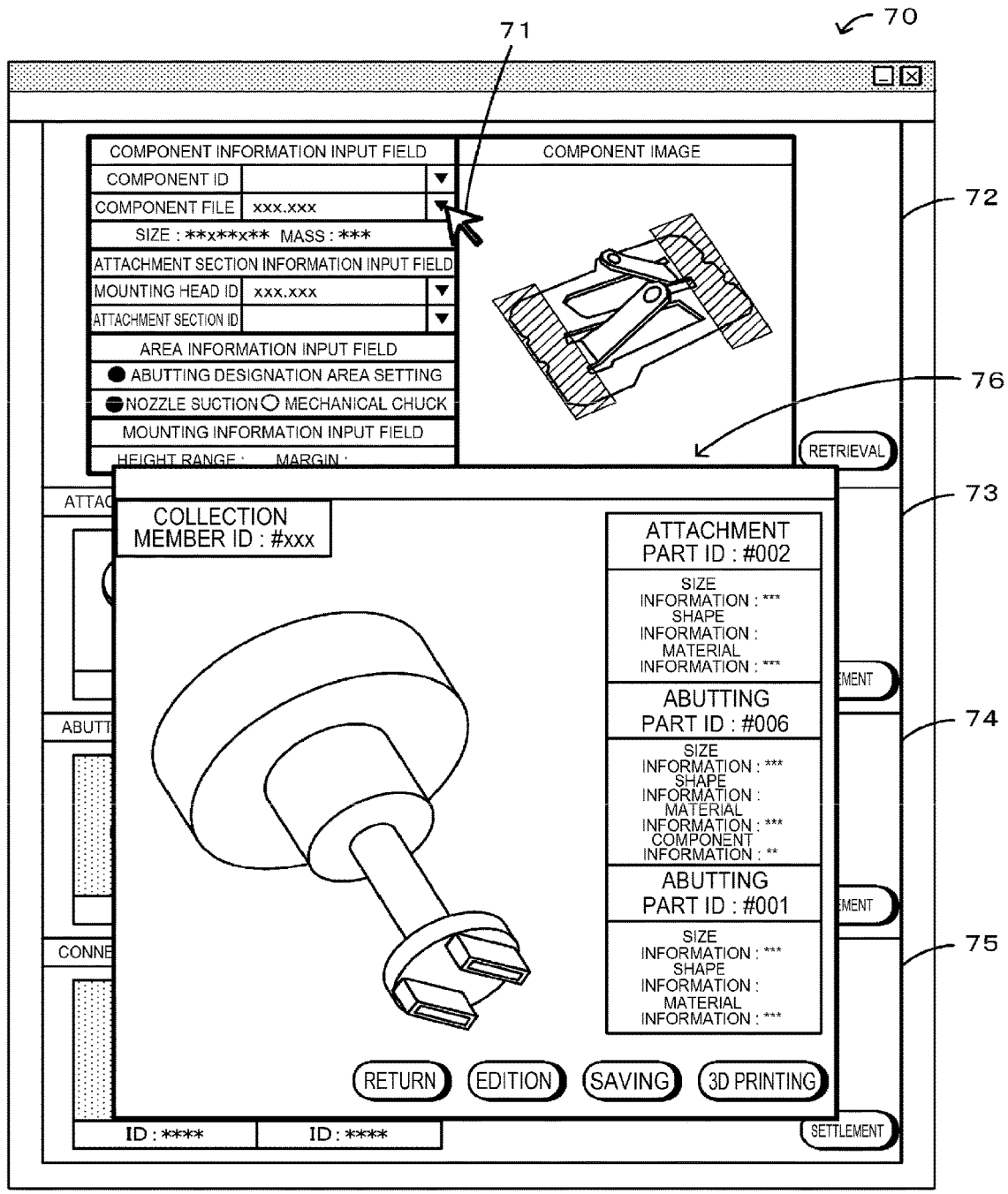
FIG. 13 is an explanatory view illustrating an example of design data display screen 76.

FIG. 13 is an explanatory view illustrating an example of design data display screen 76. Design data display screen 76 is a screen for displaying collection member 50 designed to be able to collect component P having a specific shape. Design data display screen 76 includes a collection member display field, an attachment part information display field relating to attachment part 51, an abutting part information display field relating to abutting part 52, a connection part information display field relating to connection part 53, a return key, an edition key, a saving key, a 3D printing key, and the like. The user can confirm the displayed content, re-edit the displayed content by pressing the edition key, store the design data in the memory section of customer PC 33 by pressing the saving key, or manufacture collection member 50 by 3D printer 34 by pressing the 3D printing key.

Figure 14:
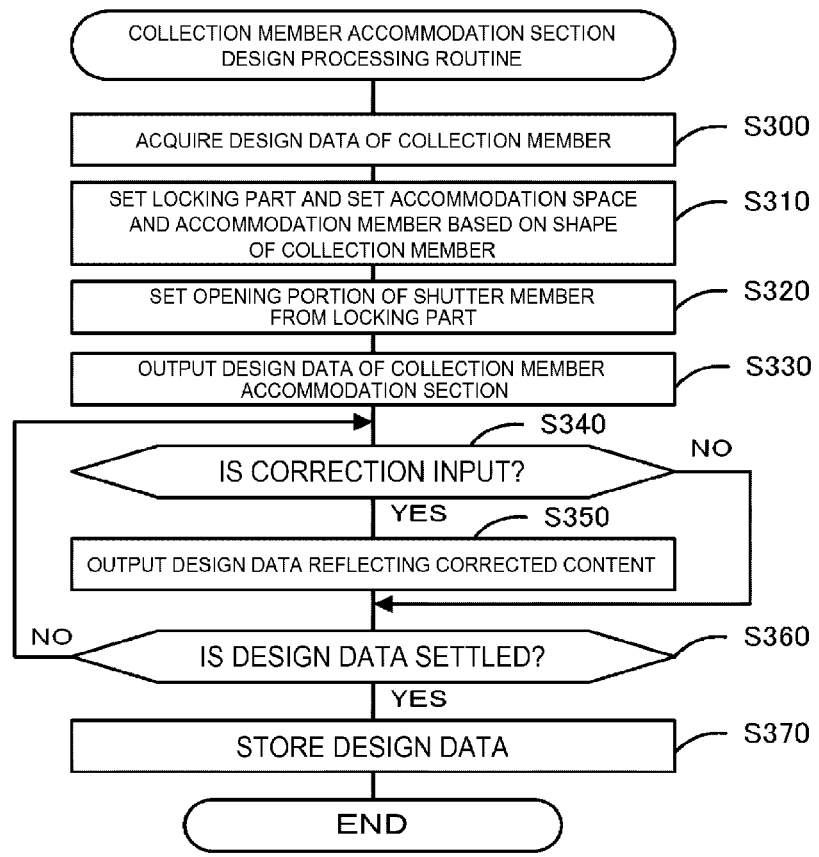
FIG. 14 is a flowchart illustrating an example of a collection member accommodation section design processing routine.

Next, processing of designing and manufacturing collection member accommodation section 55 accommodating newly designed collection member 50 will be described. Here, a case where collection member accommodation section 55G accommodating collection member 50G is designed and manufactured will be described as a specific example. FIG. 14 is a flowchart illustrating an example of a collection member accommodation section design processing routine executed by the CPU of customer PC 33. This routine is stored in the memory section of customer PC 33 and is executed after new collection member 50G is designed. When this routine is started, the CPU of customer PC 33 acquires the design data of newly designed collection member 50G (S300), sets a locking part at which collection member 50 is locked to shutter member 57, sets the accommodation space for accommodating collection member 50 based on the shape of collection member 50, and sets the shape of accommodation member 56 (S310).

FIG. 15 is an explanatory view for designing collection member accommodation section 55G for accommodating collection member 50G, in which FIG. 15A is a view for setting an accommodation space of collection member 50G, FIG. 15B is a view for designing a shape of accommodation member 56G, and FIG. 15C is a view for designing shutter member 57G. Since the upper surface of collection member 50G that can be locked by shutter member 57G at attachment part 51G is the locking part, the CPU sets the accommodation space to a depth that accommodates up to the upper surface thereof. In addition, the CPU sets a space having a diameter obtained by adding a predetermined margin to the largest width (diameter) in a range in which collection member 50G is accommodated so that the passage of collection member 50G is relatively easy (FIG. 15A). Next, the CPU sets an opening part of shutter member 57G in consideration of the locking part (S320). The CPU can select the shape of the opening portion from a circle, an oval, a circle having a cutout portion, and the like. The CPU locks collection member 50 at a fixed position and sets the opening portion in a shape through which collection member 50 can pass at a fixation releasing position. Next, the CPU outputs designed accommodation member 56 and shutter member 57 as design data of collection member accommodation section 55 (S330). Here, images of accommodation member 56G and shutter member 57G are displayed and output on the display of customer PC 33. Next, the CPU determines whether a correction has been inputted to displayed accommodation member 56 or shutter member 57 (S340), and when the correction has been inputted, stores, displays, and outputs design data reflecting the corrected content (S350).

After S350 or when no correction is inputted in S340, the CPU determines whether the design data is settled (S360), and executes the processing in S340 and the subsequent step when the design data is not settled. On the other hand, when the design data is settled in S360, the CPU stores the design data in the memory section of customer PC 33 (S370) and terminates the routine. Using this design data, the user can print out and manufacture accommodation member 56 and shutter member 57 by 3D printer 34 (refer to FIG. 15C).

Here, the correspondence relationship between the configuration elements in the present embodiment and the configuration elements of the present disclosure will be clarified. Information processing device 20 of the present embodiment corresponds to the information processing device of the present disclosure, memory section 25 corresponds to the memory section, and control section 21 corresponds to the control section. In the present embodiment, an example of the information processing method of the present disclosure is also disclosed by explaining the operation of information processing device 20.

In information processing device 20 of the present embodiment described above, it stores multiple pieces of abutting part data including the shape of abutting part 52 that abuts against component P, multiple pieces of attachment part data including the shape of attachment part 51 to be attached to attachment section 45 to which collection member 50 is attached, and multiple pieces of connection part data including the shape of connection part 53 that connects abutting part 52 and attachment part 51, and outputs one or more of the abutting part data, the attachment part data, and the connection part data to an external device such as customer PC 33. Generally, for example, collection member 50 for collecting component P having a specific shape (special shape) is individually designed according to the shape and the size of the component. Since the design data of designed collection member 50 is managed as a whole, it is difficult to efficiently utilize the development resource. In information processing device 20, for example, since individually designed collection member 50 is stored as data in a state of being divided into abutting part 52, attachment part 51, and connection part 53, each part can be used in an appropriate combination when there are individual special components. Accordingly, in information processing device 20, by managing the data for each part, it is possible to more easily realize the manufacture and use of new collection member 50.

In addition, control section 21 acquires the component information including any one or more of the identification information (component ID), the size, and the shape capable of identifying component P, searches candidates for the abutting part data, the attachment part data, and the connection part data capable of collecting component P based on the component information, and outputs the searched data. In information processing device 20, since the candidates for the respective parts are automatically searched, it is possible to more easily realize the manufacture of new collection member 50. Further, control section 21 acquires the area information including the designation area in which abutting part 52 abuts against component P, searches candidates for the abutting part data corresponding to one or more of the size, the shape, the number, and the position of the designation area, and outputs the searched abutting part data. In information processing device 20, it is possible to search the abutting part data based on the designation area. Furthermore, control section 21 acquires attachment section information including any one or more of the identification information (mounting head ID or attachment section ID), the size, and the shape capable of identifying attachment section 45, and then searches candidates for the attachment part data corresponding to the attachment section information, and outputs the searched attachment part data. In information processing device 20, the attachment part data can be searched based on the information of attachment section 45. In addition, control section 21 searches candidates for connection part data corresponding to the candidates for the abutting part data searched based on the component information and the candidates for the attachment part data searched based on the attachment section information, and outputs the searched connection part data. In information processing device 20, the connection part data corresponding to the abutting part data and the attachment part data can be searched.

In addition, memory section 25 stores the abutting part data, the attachment part data, and connection part data in which the material information relating to any one or more materials of abutting part 52, attachment part 51, and connection part 53 is associated, and control section 21 also outputs the material information. In information processing device 20, it is possible to provide each part data of collection member 50 including the material information. Therefore, the user can manufacture each part with reference to the material of each part. In addition, collection member 50 is one or more of a nozzle for collecting component P by applying a pressure and a mechanical chuck for physically collecting component P, in a case where the collection member is the nozzle, abutting part 52 includes one or more of a round nozzle, an angle nozzle, and a spork nozzle. In a case where collection member 50 is the mechanical chuck, connection part 53 includes an actuator for driving abutting part 52. In information processing device 20, it is possible to provide data of various collection members 50 such as the nozzle and the mechanical chuck. In addition, control section 21 outputs the abutting part data, the attachment part data, and the connection part data, and then when the abutting part data, the attachment part data, and the connection part data are settled, outputs the accommodation member data including the shape of accommodation member 56 in which the accommodation space for accommodating collection member 50 is formed when waiting before attaching to attachment section 45, which is determined according to the settled shape of collection member 50. In information processing device 20, since accommodation member 56 can be manufactured based on the data by outputting the data of accommodation member 56 accommodating collection member 50 to be newly manufactured, collection member 50 to be newly manufactured can be used more easily. In addition, control section 21 outputs shutter data including the shape of shutter member 57 corresponding to the shape of accommodation member 56 determined according to the settled shape of collection member 50. In addition, in information processing device 20, since new shutter member 57 can be manufactured, collection member 50 to be newly manufactured can be used more easily.

In mounting system 30, since the user on the customer side can manufacture collection member 50 by 3D printer 34 using the design data on collection member 50, the user can start using new collection member 50 in an extremely short period of time. In mounting system 30, since the design data remains in customer PC 33, collection member 50 can be manufactured from the design data as required even if collection member 50 is discarded. Therefore, it is possible to further reduce the location for accommodating collection member 50 used for many specific components which have low use frequency.

It is needless to say that the present disclosure is not limited to the embodiments described above, and may be implemented in various aspects as long as they belong to a technical scope of the present disclosure.

For example, in the above embodiments, control section 21 searches the candidates for the abutting part data, the attachment part data, and the connection part data from the candidates for the component information, the area information, the attachment section information, and the attachment part data, and the candidate for the abutting part data, but may search candidates for the abutting part data, the attachment part data, and the connection part data using other information. Alternatively, in the above embodiments, the candidates for the abutting part data, the attachment part data, and the connection part data are searched based on the component information; however, the configuration is not limited to this, and the search processing may be omitted. Also with information processing device 20, since the respective part data of collection member 50 are stored separately, the respective parts can be used in an appropriate combination, and it is possible to more easily realize the manufacture and use of new collection member 50.

In the above embodiments, attachment part information 62, abutting part information 64, and the connection part information 66 including the material information are stored in memory section 25; however, the configuration is not limited to this, and the material information may be omitted. Also in information processing device 20, since respective part data of collection member 50 are stored separately, it is possible to more easily realize the manufacture and use of new collection member 50.

Connection part 53 is described as one structure in the above embodiment; however, the configuration is not limited to this, and, for example, connection part 53 may be a structure which is divided into two or more parts. That is, the connection part data may include data of multiple portions.

Since the connection part can be freely configured, it may be managed as one, or two or more structures.

In the above embodiments, although the design processing of accommodation member 56 and shutter member 57 is executed as collection member accommodation section 55 after collection member 50 is designed, the design processing of collection member accommodation section 55 may be omitted. This is because new collection member 50 may be accommodated in existing collection member accommodation section 55.

In the above embodiments, the present disclosure is described as information processing device 20; however, the configuration is not limited to this, and may be an information processing method or an information providing program.

Here, the information processing device according to the present disclosure may be configured as follows. For example, in the information processing device according to the present disclosure, the control section may acquire component information including any one or more of identification information, a size, and a shape capable of identifying the component, and then search candidates for the abutting part data, the attachment part data, and the connection part data capable of collecting the component based on the component information, and output the searched data. In the information processing device, since the candidates for the respective parts are automatically searched, it is possible to more easily realize manufacture of a new collection member.

In the information processing device according to the present disclosure, the control section may acquire area information including a designation area in which the abutting part abuts against the component, and then search candidates for the abutting part data corresponding to one or more of a size, a shape, the number, and a position of the designation area, and output the searched abutting part data. In the information processing device, it is possible to search the abutting part data based on the designation area.

In the information processing device according to the present disclosure, the control section may acquire attachment section information including any one or more of identification information, a size, and a shape capable of identifying the attachment section, and then search candidates for the attachment part data corresponding to the attachment section information, and output the searched attachment part data. In the information processing device, it is possible to search the attachment part data based on the information on the attachment section.

In the information processing device according to the present disclosure, the control section may acquire component information including any one or more of identification information, a size, and a shape capable of identifying the component, and attachment section information including any one or more of identification information, a size, and a shape capable of identifying the attachment section, and then search candidates for the abutting part data based on the component information, search candidates for the attachment part data based on the attachment section information, search candidates for the connection part data corresponding to the searched candidates, and output the searched connection part data. In the information processing device, it is possible to search the connection part data corresponding to the abutting part data and the attachment part data.

In the information processing device of the present disclosure, the memory section may store the abutting part data, the attachment part data, and the connection part data in which material information relating to any one or more materials of the abutting part, the attachment part, and the connection part is associated, and the control section may also output the material information. In the information processing device, it is possible to provide each part data of the collection member including the material information. Therefore, the user can manufacture each part with reference to the material of each part.

In the information processing device according to the present disclosure, the collection member may be one or more of a nozzle for collecting the component by applying a pressure and a mechanical chuck for physically collecting the component. When the collection member is the nozzle, the abutting part may include one or more of a round nozzle, an angle nozzle, and a spork nozzle. When the collection member may be the mechanical chuck, the connection part may include an actuator for driving the abutting part.

In the information processing device of the present disclosure, the control section may output the abutting part data, the attachment part data, and the connection part data, and then when the abutting part data, the attachment part data, and the connection part data are settled, output accommodation member data including a shape of an accommodation member in which an accommodation space for accommodating the collection member is formed when waiting before attaching to the attachment section, which is determined according to the settled shape of the collection member. In the information processing device, by outputting data of the accommodation member accommodating the newly manufactured collection member, since the accommodation member can be manufactured based on the data, the newly manufactured collection member can be used more easily.

In the information processing device according to the present disclosure of the aspect of outputting the accommodation member data, the control section may output shutter data including a shape of a shutter member corresponding to the shape of the accommodation member determined according to the settled shape of the collection member. In addition, in the information processing device, since a new shutter member can be manufactured, the newly manufactured collection member can be used more easily.

An information processing method of the present disclosure is an information processing method used in a mounting system that performs processing of mounting a component on a mounting target, the method including: a step of acquiring component information having multiple pieces of abutting part data including a shape of an abutting part that abuts against the component, multiple pieces of attachment part data including a shape of an attachment part to be attached to an attachment section to which a collection member for collecting the component is attached, and multiple pieces of connection part data including a shape of a connection part that connects the abutting part and the attachment part, in the collection member, and including a shape of the component, and then searching candidates for the abutting part data, the attachment part data, and the connection part data capable of collecting the component based on the component information, and outputting the searched data.

In the information processing method, similarly to the information processing device described above, by managing the data for each part, it is possible to more easily realize the manufacture and use of the new collection member. In the information processing method, the aspect of the information processing device described above may be employed, or a step of expressing the function of the information processing device described above may be included.

A program of the present disclosure is provided for causing one or more computers to execute each step of the information processing method described above. The program may be recorded on a computer-readable recording medium (for example, hard disk, ROM, FD, CD, DVD, or the like), transmitted from one computer to another computer via a transmission medium (communication network such as an Internet or a LAN), or exchanged in any other manner. When the program is executed by one computer or executed by sharing respective steps in multiple computers, each step of the information processing method described above is executed, so that the same operation and effect as those of the method can be obtained.

INDUSTRIAL APPLICABILITY

The information processing device, the information providing method, and the program disclosed in the present specification can be used in the technical field of a device for mounting a component on a mounting target.

REFERENCE SIGNS LIST 10 mounting development system, 11 network, 12 LAN, 13 design PC, 20 information processing device, 21 control section, 22 CPU, 23 ROM, 24 RAM, 25 memory section, 26 display, 27 input device, 28 communication section, 30 mounting system, 32 LAN, 33 customer PC, 34 3D printer, 35 management PC, 40 mounting device, 41 control device, 42 board processing section, 43 mounting section, 44 mounting head, 45 attachment section, 46 component supply section, 47 feeder, 48 tray unit, 49 mark camera, 50, 50A to 50G collection member, 51, 51A to 51G attachment part, 52, 52A to 52G abutting part, 53, 53A to 53G connection part, 55, 55G collection member accommodation section, 56, 56G accommodation member, 57, 57G shutter member, 61 attachment part database, 62 attachment part information, 63 abutting part database, 64 abutting part information, 65 connection part database, 66 connection part information, 70 collection member design screen, 71 cursor, 72 information input field, 73 attachment part candidate display field, 74 abutting part candidate display field, 75 connection part candidate display field, 76 design data display screen, P component, S board

The invention claimed is:

1. An information processing device used in a mounting system that performs processing of mounting a component on a mounting target, the information processing device comprising:
a memory section configured to store:
multiple pieces of abutting part data including a shape of an abutting part that abuts against the component,
multiple pieces of attachment part data including a shape of an attachment part to be attached to an attachment section to which a collection member for collecting the component is attached, and
multiple pieces of connection part data including a shape of a connection part that connects the abutting part and the attachment part in the collection member; and
a control section configured to:
acquire component information including one or more of identification information, a size, or a shape capable of identifying the component,
search for at least one candidate abutting part capable of collecting the component based on the component information,
search for at least one candidate attachment part capable of collecting the component based on the component information,
search for at least one candidate connection part capable of collecting the component based on the component information, and
output one or more of the abutting part data corresponding to the at least one candidate abutting part, the attachment part data corresponding to the at least one candidate attachment part, or the connection part data corresponding to the at least one candidate connection part.

2. The information processing device according to claim 1, wherein the control section is configured to:
acquire area information including a designation area in which the abutting part abuts against the component,
search for the at least one candidate abutting part corresponding to one or more of a size, a shape, a number, or a position of the designation area,
output the abutting part data corresponding to the at least one candidate abutting part.

3. The information processing device according to claim 1, wherein the control section is configured to:
acquire attachment section information including one or more of identification information, a size, or a shape capable of identifying the attachment section,
search for the at least one candidate attachment part corresponding to the attachment section information, and
output the attachment part data corresponding to the at least one candidate attachment part.

4. The information processing device according to claim 1, wherein the control section is configured to:
acquire attachment section information including one or more of identification information, a size, or a shape capable of identifying the attachment section,
search for the at least one candidate attachment part based on the attachment section information,
search for the at least one candidate connection part corresponding to the at least one candidate abutting part and the at least one candidate attachment part, and
output the connection part data corresponding to the at least one candidate connection part.

5. The information processing device according to claim 1, wherein
the memory section is configured to store the abutting part data, the attachment part data, and the connection part data in association with material information relating to one or more materials of the abutting part, the attachment part, or the connection part, and
the control section is configured to output the material information.

6. The information processing device according to claim 1, wherein
the collection member is one or more of a nozzle for collecting the component by applying a pressure or a mechanical chuck for physically collecting the component,
when the collection member is the nozzle, the abutting part includes one or more of a round nozzle, an angle nozzle, or a spork nozzle, and
when the collection member is the mechanical chuck, the connection part includes an actuator for driving the abutting part.

7. The information processing device according to claim 1, wherein the control section is configured to:
output the abutting part data corresponding to the at least one candidate abutting part, the attachment part data corresponding to the at least one candidate attachment part, and the connection part data corresponding to the at least one candidate connection part, and when the abutting part data corresponding to the at least one candidate abutting part, the attachment part data corresponding to the at least one candidate attachment part, and the connection part data corresponding to the at least one candidate connection part are settled, output accommodation member data, which is determined according to a settled shape of the collection member, including a shape of an accommodation member in which an accommodation space for accommodating the collection member is formed when waiting before attaching to the attachment section.

8. The information processing device according to claim 7, wherein the control section is configured to output shutter data including a shape of a shutter member corresponding to the shape of the accommodation member determined according to the settled shape of the collection member.

9. An information processing method performed by the information processing device according to claim 1, the method comprising:
acquiring the component information,
searching for the at least one candidate abutting part,
searching for the at least one candidate attachment part,
searching for the at least one candidate connection part, and
outputting the one or more of the abutting part data corresponding to the at least one candidate abutting part, the attachment part data corresponding to the at least one candidate attachment part, or the connection part data corresponding to the at least one candidate connection part.

10. A non-transitory computer readable medium storing a program for causing the control section to execute the information processing method according to claim 9.

* * * * *